United States Patent
Ko

(10) Patent No.: US 7,416,917 B2
(45) Date of Patent: Aug. 26, 2008

(54) METHOD OF FABRICATING ELECTROLUMINESCENT DISPLAY

(75) Inventor: Chung-Wen Ko, Sijhih (TW)

(73) Assignee: Au Optronics Corp., Hsinchu (TW)

( * ) Notice: Subject to any disclaimer, the term of this patent is extended or adjusted under 35 U.S.C. 154(b) by 242 days.

(21) Appl. No.: 11/268,847

(22) Filed: Nov. 8, 2005

(65) Prior Publication Data
US 2006/0220008 A1    Oct. 5, 2006

(30) Foreign Application Priority Data
Mar. 14, 2005    (TW) .............................. 94107672 A

(51) Int. Cl.
*H01L 51/40*    (2006.01)
*H01L 21/338*   (2006.01)
*H01L 21/00*    (2006.01)

(52) U.S. Cl. ........................ 438/99; 438/179; 438/82; 257/E21.123

(58) Field of Classification Search .................. 438/99, 438/179, 82; 257/E21.123
See application file for complete search history.

(56) References Cited

U.S. PATENT DOCUMENTS

| 5,683,823 | A | * | 11/1997 | Shi et al. ..................... 428/690 |
| 5,814,416 | A |   | 9/1998  | Dodabalapur et al. |
| 6,133,692 | A |   | 10/2000 | Xu et al. ..................... 313/506 |
| 6,243,146 | B1 | * | 6/2001 | Rho et al. ..................... 349/42 |
| 6,274,979 | B1 | * | 8/2001 | Celii et al. .................. 313/506 |
| 6,737,800 | B1 | * | 5/2004 | Winters et al. .............. 313/504 |
| 6,812,637 | B2 | * | 11/2004 | Cok et al. ................... 313/503 |
| 7,023,013 | B2 | * | 4/2006 | Ricks et al. ................... 257/40 |
| 2004/0155576 | A1 | * | 8/2004 | Tyan et al. .................. 313/504 |
| 2005/0040756 | A1 | * | 2/2005 | Winters et al. .............. 313/504 |
| 2005/0062903 | A1 | * | 3/2005 | Cok et al. .................... 349/69 |
| 2005/0073230 | A1 | * | 4/2005 | Nishikawa et al. .......... 313/111 |
| 2005/0100657 | A1 | * | 5/2005 | MacPherson et al. ......... 427/58 |
| 2005/0236981 | A1 | * | 10/2005 | Cok et al. .................... 313/504 |

OTHER PUBLICATIONS

China Office Action mailed Jul. 6, 2007.

* cited by examiner

*Primary Examiner*—Scott B. Geyer
*Assistant Examiner*—Seahvosh J Nikmanesh
(74) *Attorney, Agent, or Firm*—Thomas, Kayden, Horstemeyer & Risley

(57) ABSTRACT

A method for fabrication organic light emitting diode (OLED) displays. A white light OLED element is formed on the first substrate. A micro-cavity layer is formed on a second substrate. A color filter is formed on the micro-cavity layer. The first and the second substrates are assembled, wherein the light of white OLED element passes through the color filter and the micro-cavity layer.

9 Claims, 5 Drawing Sheets

METHOD OF FABRICATING ELECTROLUMINESCENT DISPLAY

BACKGROUND

The invention relates to methods of fabricating electroluminescent displays, and more particularly, to methods of fabricating organic light emitting diode (OLED) displays with multi-mode micro-cavity layers.

Among flat panel displays, organic light emitting diode (OLED) displays exhibit characteristics of self-emission, high brightness, wide viewing angle, high response, simple fabrication process, low power consumption, and good outdoor reliability, and are therefore widely applied in portable computers, notebooks, mobile phones, and personal digital assistances (PDAs).

To achieve full color display, a conventional OLED display comprises OLED elements having red, green, and blue pixels, separately formed on an active matrix substrate. Conventional fabrication methods for OLED displays require precision alignment and a shadow mask process, thus the fabrication process is complicated.

White light OLED displays with color filter thereon are proposed to simplify fabrication. U.S. Pat. No. 6,133,692, the entirety of which is hereby incorporated by reference, discloses a method of fabricating white light OLED displays. FIG. 1 is a cross section of a conventional white light OLED display. A white light OLED display 10 comprises an organic light emitting diode element 11, a multi-mode micro-cavity layer 12, and a color filter 13, disposed on a transparent substrate 14. The organic light emitting diode element 11 comprises an upper electrode 15, at least one light emitting layer 16, and a lower electrode 18. A mirror stack structure 21 is interposed between the lower substrate 18 and color filter 13.

Since the light from the conventional white light OLED display comprises a broadband spectrum, even after passing through a color filter, each red, green, and blue light is still broadband. The colors of the white light OLED display are less saturated than in a conventional tri-color OLED display. Moreover, a color filter of a conventional white light OLED display is organic, and the multi-mode micro-cavity layer is metal or an inorganic material. From a processing point of view, forming an organic color filter at low temperature prior to a micro-cavity layer at high temperature of may complicate the fabrication process, reducing the process window and increasing production costs.

SUMMARY

Accordingly, the invention provides an organic light emitting diode (OLED) display with a multi-mode micro-cavity layer, enhancing color saturation and process compatiblity.

The invention also provides a method for fabricating an organic light emitting diode (OLED) display. A white light OLED element is formed on a first substrate. At least one micro-cavity layer is formed on a second substrate. A color filter is formed on the at least one micro-cavity layer. The first substrate and the second substrate are assembled opposing each other, whereby a white light emitted by the OLED element sequentially passes through the color filter and the micro-cavity layer.

The invention further provides a method for fabricating an organic light emitting diode (OLED) display. At least one micro-cavity layer is formed on a substrate. A color filter is formed on the at least one micro-cavity layer. A white light OLED element is formed on the color filter.

DESCRIPTION OF THE DRAWINGS

The invention can be more fully understood by reading the subsequent detailed description in conjunction with the examples and references made to the accompanying drawings, wherein.

DETAILED DESCRIPTION

Figure 1:
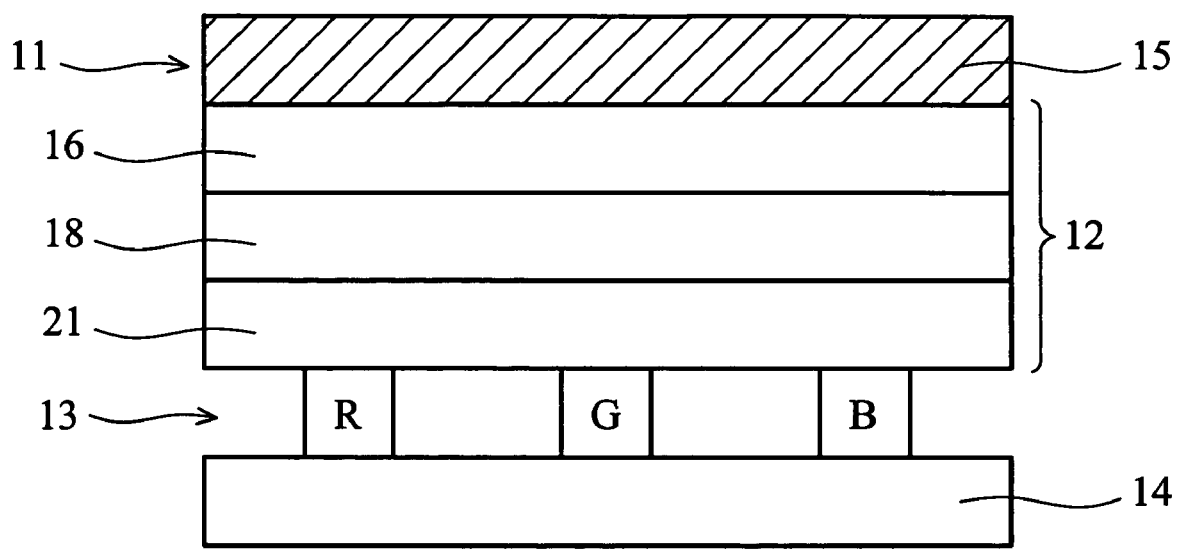
FIG. 1 is a cross section of a conventional white light OLED display.
Figure 2A:
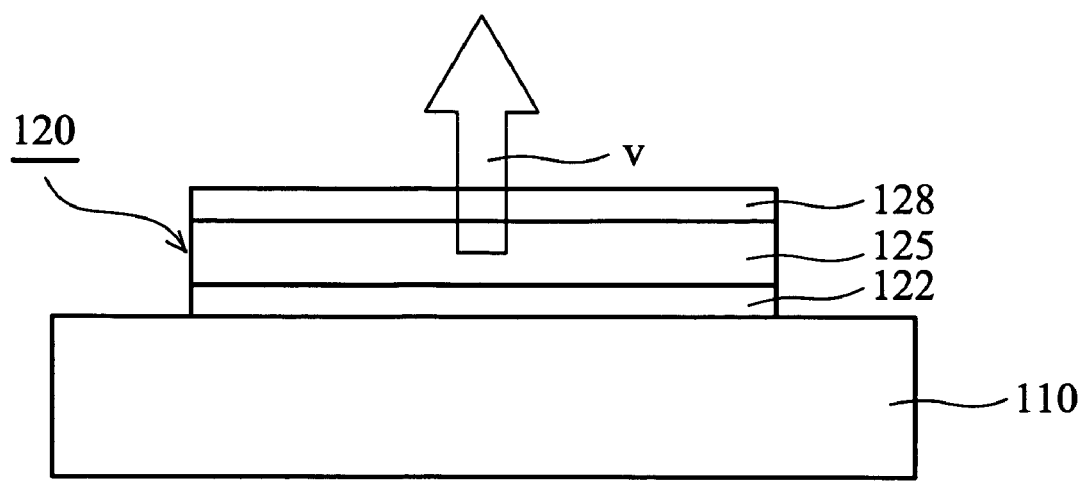
FIGS. 2A-2C are cross sections of an embodiment of a method of fabricating an organic light emitting diode (OLED) device.
Figure 2B:
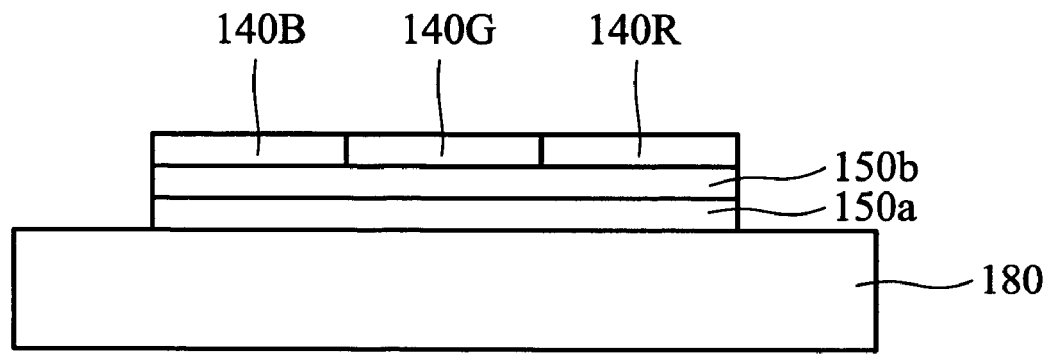
Figure 2C:
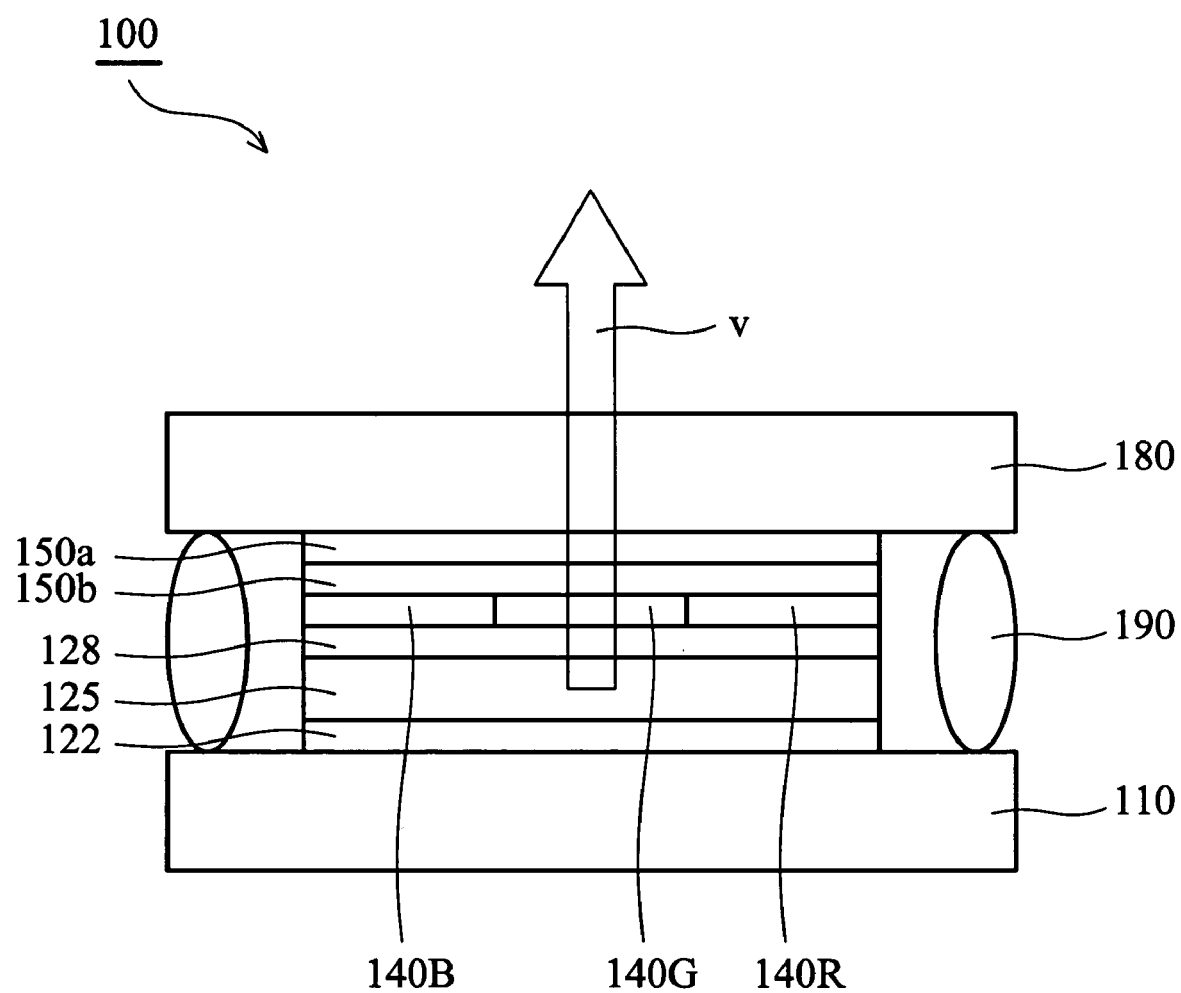

FIGS. 2A-2C are cross sections of an embodiment of a method of fabricating an organic light emitting diode (OLED) device. Referring to FIG. 2A, a white light organic light emitting diode (OLED) element 120 is formed on a first substrate 110, comprising a transparent substrate such as glass or a thin film transistor (TFT) array substrate. The white OLED element 120 comprises a first electrode 122, an organic light emitting structure 125, and a second electrode 128. The white OLED element 120, preferably a top emission OLED, emitting light toward an observer in the direction indicated by arrow v, emits spectrums comprising red (R), green (G), and blue (B) colors.

The first electrode 122 such as an anode is an electrode for hole injection, preferably comprising indium tin oxide (ITO), indium zinc oxide (IZO), silver (Ag), or other high work function material.

The organic light emitting structure 125 preferably comprises an electron transport layer (ETL), an organic light emitting layer, and a hole transport layer (HTL). The organic light emitting layer 125 can be oligomer, polymer, or organic metallic complexes.

A second electrode 128 such as cathode is a metal electrode for electron injection, preferably comprising calcium (Ca), magnesium (Mg), aluminum (Al), or other low work function material. Alternatively, the second electrode may comprise. Ca—Al dual layer, Mg—Ag dual layer, LiF—Al dual layer or Mg—Ag alloy or stacks comprising ITO layer and electrodes thereof.

Referring to FIG. 2B, micro-cavity layers 150a and 150b are formed on the second substrate 180. Micro-cavity layers 150a and 150b may comprise one or more materials with different refraction indices, such as oxides, nitrides, semiconductors, metals, or combination thereof. For example, oxides comprise silicon oxide ($SiO_2$) titanium oxide ($TiO_2$), tantalum oxide ($Ta_2O_5$), tin oxide ($SnO_2$), indium tin oxide (ITO), indium zinc oxide (IZO), or zinc oxide (ZnO). Nitrides may comprise silicon nitride ($Si_3N_4$). Alternatively, the semiconductor may comprise zinc sulfide (ZnS), zinc selenide (ZnSe), gallium arsenide (GaAs). Metals comprise aluminum (Al), silver (Ag), magnesium (Mg), lithium (Li), or calcium (Ca).

Color filters comprising 140R, 140G, and 140G are subsequently formed on the micro-cavity layers 150a and 150b. The color filters 140R, 140G, and 140G may comprise organic materials formed by dying, pigment dispersion, printing, and electrochemical deposition.

Referring to FIG. 2C, the first substrate 110 and the second substrate 180 are assembled opposing each other such that the white OLED element directly contacts the color filters 140R, 140G, and 140G. The peripheral region of the first substrate 110 and the second substrate 180 is sealed by sealer 190. Alternatively, the first substrate 110 and the second substrate 180 can be assembled in a frame.

According to an embodiment of the invention, a white light emitted by the OLED element sequentially passes through the color filters 140R, 140G, and 140B and the micro-cavity layers 150a and 150b. Composition and reflection index can be varied according to light passing through the color filters 140R, 140G, and 140B, to optimize color saturation.

From the fabrication point of view, a high fabrication temperature process should occur prior to a low fabrication temperature process. Therefore, inorganic micro-cavity layers 150a and 150b are formed on the second substrate 180 at high temperature. The organic color filters 140R, 140G, and 140B are sequentially formed on the micro-cavity layers 150a and 150b at low temperature. Moreover, the micro-cavity layers 150a and 150b the color filters 114R, 140G, and 140B can be formed using a single lithographic process, thereby reducing fabrication costs.

Figure 3A:
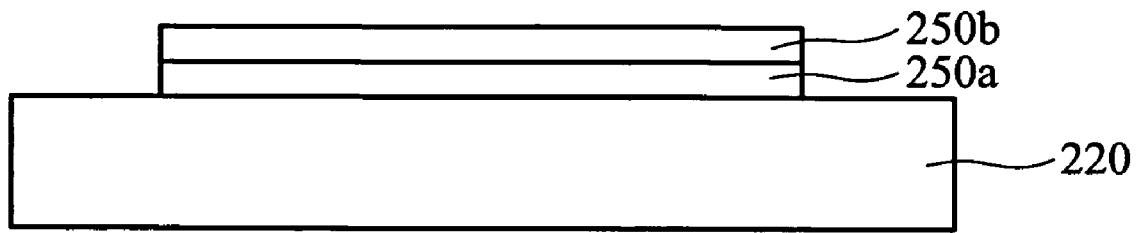
FIGS. 3A-3C are cross sections of another embodiment of a method of fabricating an organic light emitting diode (OLED) device.
Figure 3B:
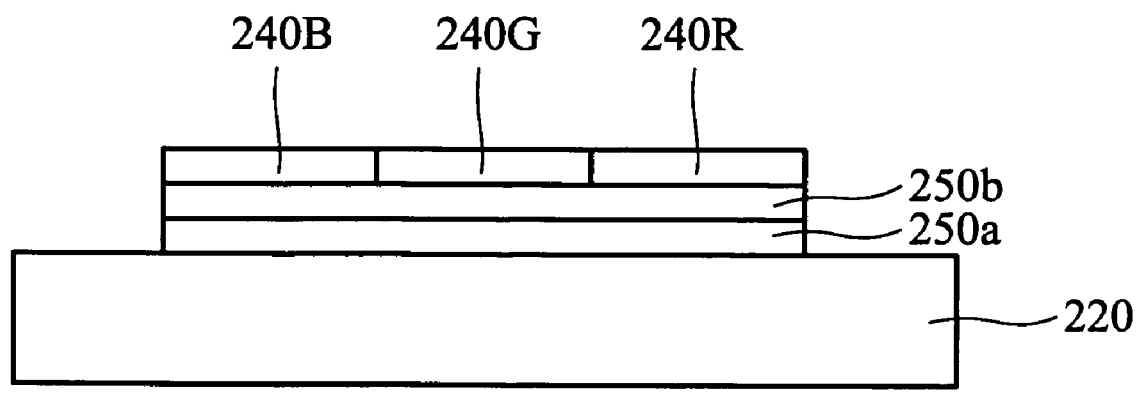
Figure 3C:
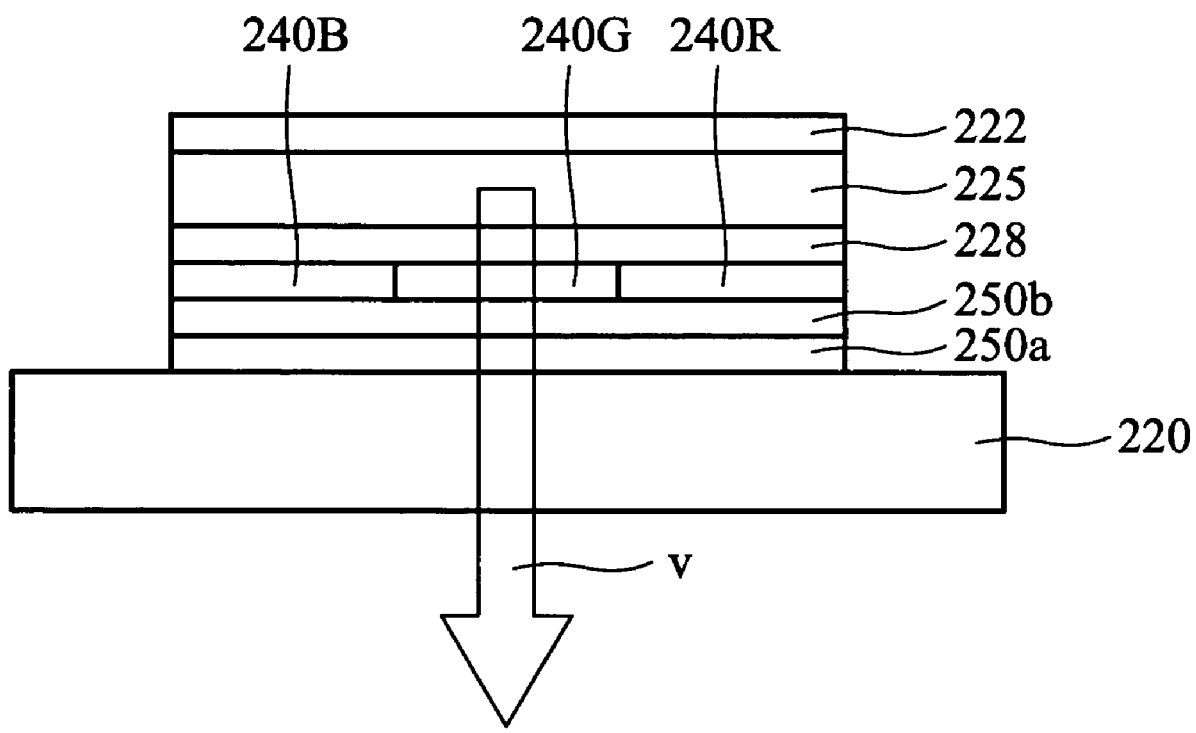

FIGS. 3A-3C are cross sections of another embodiment of a method of fabricating an organic light emitting diode (OLED) device. Referring to FIG. 3A, micro-cavity layers 250a and 250ba are formed on a first substrate 220, comprising a transparent substrate such as glass or a thin film transistor (TFT) array substrate. Micro-cavity layers 250a and 250b may comprise one or more materials with different refraction indices, such as oxides, nitrides, semiconductors, metals, or combination thereof. Exemplary oxides include silicon oxide ($SiO_2$), titanium oxide ($TiO_2$), tantalum oxide ($Ta_2O_5$), tin oxide ($SnO_2$), indium tin oxide (ITO), indium zinc oxide (IZO), or zinc oxide (ZnO). Nitrides may comprise silicon nitride ($Si_3N_4$). Alternatively, semiconductor may comprise zinc sulfide (ZnS), zinc selenide (ZnSe), gallium arsenide (GaAs). Metals comprise aluminum (Al), silver (Ag), magnesium (Mg), lithium (Li), or calcium (Ca).

Referring to FIG. 3B, color filters comprising 240R, 240G, and 240G are subsequently formed on the micro-cavity layers 250a and 250b. The color filters 240R, 240G, and 240G may comprise organic material formed by dying, pigment dispersion, printing, and electrochemical deposition.

Referring to FIG. 3C, a white OLED element 220 is formed on the color filters 240R, 240G, and 240G. The white OLED element 220 comprises a first electrode 228, an organic light emitting structure 225, and a second electrode 222. The white OLED element 220, preferably a bottom emission OLED, emitting light toward an observer in the direction indicated by arrow v, emits spectrums comprising red (R), green (G), and blue (B) colors.

The first electrode 228 such as an anode is an electrode for hole injection, preferably comprising indium tin oxide (ITO) indium zinc oxide (IZO) silver (Ag), or other high work function material.

The organic light emitting structure 225 may preferably comprise an electron transport layer (ETL), an organic light emitting layer, and a hole transport layer (HTL). The organic light emitting layer 125 can be oligomer, polymer, or organic metallic complexes.

A second electrode 222, such as a cathode, is a metal electrode for electron injection, preferably comprising, calcium (Ca), magnesium (Mg), aluminum (Al), or other low work function material. Alternatively, the second electrode may comprise Ca—Al dual layer, Mg—Ag dual layer, LiF—Al dual layer or Mg—Ag alloy or stacks comprising ITO layer and electrodes thereof.

According to an embodiment of the invention, a white light emitted by the OLED element 220 sequentially passes through the color filters 240R, 240G, and 240B and the micro-cavity layers 250a and 250b. The composition and reflection index can be varied according to light passing through the color filters 240R, 240G, and 240B, to optimize color saturation.

From the fabrication point of view, a high fabrication temperature process should occur prior to a low fabrication temperature process. Therefore, inorganic micro-cavity layers 250a and 250b are formed on the second substrate 180 at high temperature. The organic color filters 140R, 140G, and 140B and organic light emitting structure 225 are sequentially formed on the micro-cavity layers 250a and 250b at low temperature. Moreover, the micro-cavity layers, 250a and 250b and the color filters 240R, 240G, and 240B can be formed using a single lithographic process, thereby reducing fabrication costs.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for fabricating an organic light emitting diode (OLED) display, comprising:
   forming a white light OLED element on a first substrate;
   forming at least one micro-cavity layer on a second substrate;
   forming a color filter on the at least one micro-cavity layer; and
   assembling the first substrate and the second substrate opposing each other, whereby a white light emitted by the OLED element sequentially passes through the color filter and the at least one micro-cavity layer.

2. The method as claimed in claim 1, wherein the white light OLED element comprises a top emission OLED element.

3. The method as claimed in claim 1, wherein the white light emitted by the OLED element is comprised of red, green, and blue light.

4. The method as claimed in claim 1, wherein the at least one micro-cavity layer has one or more different refraction indices.

5. The method as claimed in claim 1, wherein the at least one micro-cavity layer comprises oxide, nitride, semiconductor, metal, or combinations thereof.

6. The method as claimed in claim 5, wherein the oxide comprises $SiO_2$, $TiO_2$, $Ta_2O_5$, $SnO_2$, indium tin oxide (ITO), indium zinc oxide (IZO), or ZnO.

7. The method as claimed in claim 5, wherein the nitride comprises $Si_3N_4$.

8. The method as claimed in claim 5, wherein the semiconductor comprises ZnS, ZnSe, or GaAs.

9. The method as claimed in claim 5, wherein the metal comprises Al, Ag, Mg, Li, or Ca.

* * * * *